US007774929B2

(12) United States Patent
Jacobs

(10) Patent No.: US 7,774,929 B2
(45) Date of Patent: Aug. 17, 2010

(54) METHOD OF SELF-ASSEMBLY ON A SURFACE

(75) Inventor: Heiko O. Jacobs, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 619 days.

(21) Appl. No.: 11/686,137

(22) Filed: Mar. 14, 2007

(65) Prior Publication Data

US 2007/0215273 A1   Sep. 20, 2007

Related U.S. Application Data

(60) Provisional application No. 60/782,248, filed on Mar. 14, 2006.

(51) Int. Cl.
*H01R 43/00* (2006.01)
(52) U.S. Cl. ............... 29/825; 29/832; 29/833; 438/26; 438/116
(58) Field of Classification Search ............... 29/825, 29/832, 833; 438/26, 116
See application file for complete search history.

(56) References Cited

U.S. PATENT DOCUMENTS

| 5,075,253 | A | * | 12/1991 | Sliwa, Jr. ............... 438/109 |
| 5,545,291 | A | | 8/1996 | Smith et al. ............... 438/107 |
| 5,824,186 | A | | 10/1998 | Smith et al. ............... 156/655.1 |
| 5,904,545 | A | | 5/1999 | Smith et al. ............... 438/455 |
| 6,780,696 | B1 | | 8/2004 | Schatz ............... 438/216 |
| 6,962,823 | B2 | | 11/2005 | Empedocles et al. ............ 438/3 |
| 7,151,209 | B2 | | 12/2006 | Empedocles et al. ........ 438/689 |
| 7,625,780 | B2 | * | 12/2009 | Jacobs et al. ............... 438/116 |
| 2002/0064909 | A1 | | 5/2002 | Gracias et al. ............... 438/129 |
| 2003/0087533 | A1 | | 5/2003 | Stupp et al. ............... 438/745 |
| 2005/0214952 | A1 | | 9/2005 | Stupp et al. ............... 438/1 |
| 2005/0282307 | A1 | | 12/2005 | Daniels ............... 438/82 |
| 2006/0063289 | A1 | | 3/2006 | Negley et al. ............... 438/26 |
| 2006/0191125 | A1 | | 8/2006 | Gracias et al. ............... 29/592.1 |
| 2006/0223205 | A1 | | 10/2006 | Jacobs et al. ............... 428/22 |
| 2007/0087469 | A1 | | 4/2007 | Daniels ............... 438/99 |

OTHER PUBLICATIONS

Office Action for related U.S. Appl. No. 11/375,701, filed Mar. 14, 2006; 10 pages.
Jacobs, Heiko "Fabrication of a Cylindrical Display by Patterned Assembly" Science vol. 296 Apr. 12, 2002; pp. 323-325.
Onoe, Hiroaki "Three-Dimensional Micro-Self-Assembly Using Hydrophobic Interaction Controlled by Self-Assembled Monolayers" IEEE Journal of Microelectromechanical Systems vol. 13 No. 4, Aug. 2004; pp. 603-611.
"Sequential Shape-and-Solder-Directed Self-Assembly of Functional Microsytems", by Zheng et al., *PNAS*, vol. 1, No. 35, Aug. 31, 2004, pp. 12814-12817.

* cited by examiner

*Primary Examiner*—C. J Arbes
(74) *Attorney, Agent, or Firm*—Westman, Champlin & Kelly, P.A.

(57) ABSTRACT

A method of self-assembly of components on a surface of a substrate includes obtaining a first component and a second component. The first component type is assembled onto the substrate by programming the surface. The second component type is assembled by reprogramming the surface. A third component, next to the first and second components, is assembled following the step of assembling the first and second components. The first, second, and third components are all different types of components. docking sites on the substrate can be used that contain alignment pedestals. One component delivery system employ a liquid-liquid interface to deliver and concentrate components with correct pre-orientation.

7 Claims, 11 Drawing Sheets

MICROSYSTEMS ARRAY
WITH n=9 systems

SINGLE MULTI-COMPONENT
MICROSYSTEM m=4

METHOD OF SELF-ASSEMBLY ON A SURFACE

CROSS-REFERENCE TO RELATED APPLICATION

The present application is based on and claims the benefit of U.S. provisional patent application Ser. No. 60/782,248, filed Mar. 14, 2006, the content of which is hereby incorporated by reference in its entirety.

GOVERNMENT RIGHTS

The United States government has certain rights in this invention pursuant to Agency Grant No. ECS-0300263 awarded by the National Science Foundation.

BACKGROUND OF THE INVENTION

Fabrication strategies that rely on mechanisms of self-assembly are widely recognized as inevitable tools in nanotechnology. Self-assembly is not limited to the nanometer length scale. Strategies that are based on self-assembly are projected to have a major impact in the manufacturing of systems on both, the micro, and nanometer length scale. Previous demonstrations of a directed self-assembly to generate functional electrical microsystems include the coplanar integration of segmented integrated circuits (IC) using capillary forces, shape-directed fluidic methods to position electronic devices on planar surfaces, hydrophobic-hydrophilic surface directed self-assembly to integrate micro-optical components on silicon substrates, and liquid-solder directed self-assemblies to form functional two and three dimensional systems. In most self-assembly procedures, all receptors are active during the assembly process. These systems allow the positioning of a large number of identical components onto planar and non-planar surfaces in a massively parallel manner. However, the adaptation of self-assembly to microelectronic systems, which consists of more than one repeating unit, is difficult to achieve due to insufficient power of recognition. For example, in shape-directed fluid self-assembly, small device components settle into the holes designed to match the shape of larger components; similarly, in surface tension driven self-assembly, the binding sites designed for one component will almost always find an overlap with the receptor for a different one. As a result the assembly of electrically functional heterogeneous systems that are built using non-identical components has not been possible. Another challenge is the integration of components with distinct angular orientation. Angular orientation control is important because dies, packaging, or optical elements need to be placed on a substrate with correct angular orientation to enable contact pad registration or device operation. Angular orientation control has been challenging in self-assembly. For example, a part with a square shaped binding side self-assembles onto a square shaped receptor with four stable angular orientations 0, 90, 180, and 270°. While specific designs in the shape of the receptors and binding sites have been tested to favor one orientation over the other, the removal of defects due to local energy minima and partial overlap between receptors and binding sites remain unsolved. Finally the distinctive elements of this technology are component assembly and arrangement with single angular orientation, assembly of more than one component type on the same substrate, electrical connectivity, and contact pad registration, while it shares the parallel nature of all self-assembly processes.

SUMMARY OF THE INVENTION

A method of self-assembly of components on a surface of a substrate includes obtaining a first component and a second component. The first component type is assembled onto the substrate by programming the surface. The second component type is assembled by reprogramming the surface. A third component, next to the first and second components, is assembled following the step of assembling the first and second components. The first, second and third components are all different types of components.

A second compatible method of self-assembly of components with unique angular orientation and contact pad registration describing design rules of "two-element docking sites" on the substrate that contain alignment pedestals and solder-coated areas that are designed according to the size and shape of the components (dies), in particular the location and shape of the contact pads.

A third compatible method of self-assembly of highly miniaturized components at higher self-assembly speeds using a novel component deliver system that makes use of the dynamic angle between three interfaces that are formed by substrate that intersects a liquid-liquid interface that holds the assembly components. The liquid-liquid interface concentrates the assembly components in a two dimensional sheet. Downward motion of the substrate intersecting this sheet results in fast delivery of the components due to a dynamic change of the angle of the liquid-liquid interface. The dynamic change in angle pushes the components against the substrate.

Another aspect of the invention relates to an extension that combines the described self-assembly method with existing transfer solution. Chiplet transfer processes have been investigated in recent years as a means to transfer semiconducting materials and chiplets from one substrate to another. The combined solution of programmed self-assembly with transfer technology provides a unique solution to the massively parallel flip chip integration of components with minimal restrictions on the distance, location, size, and pitch of interconnects between the components and the final substrate. The self-assembly enables the massively parallel redistribution and reordering of components.

DETAILED DESCRIPTION OF ILLUSTRATIVE EMBODIMENTS

Figure 1A:
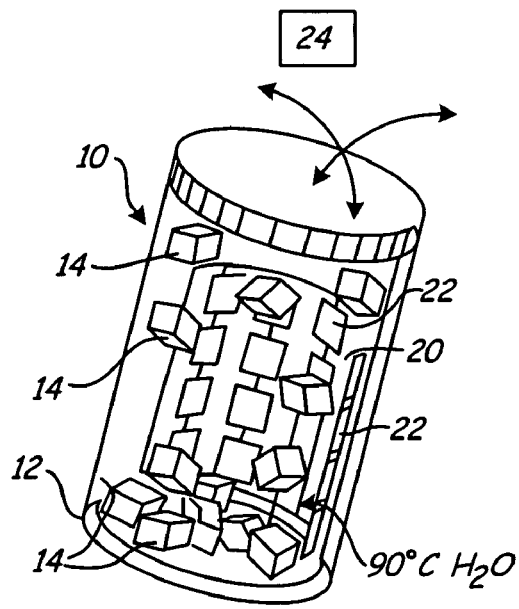
FIG. 1A is a perspective view showing self-assembly in accordance with one configuration of the invention.

One aspect of the present invention relates to programmable reconfigurable liquid solder directed self-assembly (PRS) process to enable heterogeneous integration of components (e.g., dies, chips, chiplets) on non-planar substrates. The process makes use of solder-based receptors that can be activated locally. Metal contacts on segmented semiconductor devices bind to liquid-solder-based-receptors on a substrate surface during the fluidic self-assembly. Programmability is implemented using solder-based receptors that can be switched "ON" and "OFF" using integrated heaters or scanning lasers. The feasibility of the PRS concept has been evaluated through computer simulations using ANSYS to estimate: (i) the necessary power to heat selected receptors to above the melting point of the solder, (ii) the minimal spacing between receptors for preventing thermal crosstalk, and (iii) the effect of the liquid flow in the agitated assembly solution. We fabricated a prototype substrate to experimentally test the feasibility of PRS and successfully demonstrate the programmable assembly of multiple types of components (e.g., dies, chips, chiplets) onto target positions. Four types of components (e.g., dies, chips, chiplets) have been assembled including differently sized silicon device surrogates, GaAlAs/GaAs, GaP/GaP, and GaP/GaAsP LEDs. The dimensions of the components (e.g., dies, chips, chiplets) ranged between 280-500 µm. The process makes use of sequentially activated receptors and provides a new concept to the parallel integration of micro and potentially nanoscale devices and systems that require electrical interconnects between components (e.g., dies, chips, chiplets) that are heterogeneous both in terms of materials and in terms of physical dimensions.

In another aspect, the invention addresses the challenge of die assembly that requires assembly with single angular orientation. The process overcome limitations of some self-assembly processes that require very specific die geometries—L or T shaped blocks for angular orientation and trapezoids to prevent up-side down assembly—that are not common in the microelectronics industry; most dies are square in shape. The process aims at assembly of cubes and rectangular die forms which are most common in the industry. The process employs "two-element docking sites" on the substrate that contain alignment pedestals and solder-coated areas that are designed according to the size and shape of the components (e.g., dies, chips, chiplets), in particular the location and shape of the contact pads. The pedestals act as chaperones for the solder directed assembly to take place. The directed flip-chip assembly of one hundred silicon blocks, 900 and 500 micrometers in size, is examined with 19 micrometer lateral and 0.3 degree angular contact pad registration accuracy.

In yet another aspect, the invention addresses the challenge of scale reduction to 20 µm sized components. One solution involves the use of a liquid-liquid interface to concentrate component delivery and speed up the self-assembly process to prevent oxidative dissolution of the solder sites prior to completion of the self-assembly.

The present invention relates to the use of programmable sequential methods to overcome limitations of prior techniques and to enable the formation of heterogeneous systems. This invention provides three recent innovations: 1. Programmable assembly, 2. Assembly of conventional die-forms with unique angular orientation, and 3. Accelerated assembly using concentrated component delivery.

A1. Programmable Assembly

A programmable reconfigurable liquid solder directed self-assembly (PRS) method has been developed for the assembly of electrically functional heterogeneous systems. Our fluidic self-assembly process makes use of solder-based receptors that can be switched "ON" and "OFF" locally. Metal contacts on the semiconductor device segments bind to activated liquid-solder-based-receptors on the substrate surface during the fluidic self-assembly process. The liquid-solder-coated areas act as receptors for subunits during the assembly (no manipulator is needed), they form rigid bonds upon solidification (no adhesive is needed), and provide electrical input/output-connectors to operate the final device (no wirebonder is needed). Programmability has been tested using three different methods: integrated heaters, a scanning laser, and a sequential electroplating approach. The programmability enables the heterogeneous batch integration of components (e.g., dies, chips, chiplets) by sequentially activating selected receptor sites. The advantage of the assembly process over robotic assembly lines is that it is massively parallel—in each sequence thousands of components could be assembled at the same time—as a result the duration would not increase with the number of systems that need to be manufactured. The implementations can also be modeled using theoretical calculations: For example a feasibility study is presented. In particular, the required heating power to activate a receptor and the cross-talk between receptors with decreasing dimensions with and without liquid flow is estimated. Theoretical calculations are confirmed experimentally by demonstrating the heterogeneous assembly of different semiconductor chips on flexible and curved substrates. The assembly of three non-identical semiconductor chips (GaAs, Si, GaP) with different dimensions ranging from (280 µm-500 µm) has been accomplished. In one experiment, 360 device segments have been assembled in three successive steps without defects.

Alternate solutions to activate the receptors may also be used. Some are discussed and demonstrated experimentally. Another solution uses a scanning laser system to activate the solder sites photochemically. A third solution uses a sequential electrochemical approach to deposit solder into addressable regions for the self-assembly of the semiconductor dies to occur in a subsequent step.

A2. Assembly of Conventional Die Forms with Unique Angular Orientation

Another aspect of the present invention includes the integration of multiple dies (components) on the same substrate with unique angular orientation. Unique angular orientation can be accomplished by introducing pedestals and by applying the sequential solder-directed self-assembly process to the flip-chip assembly of semiconductor dies. Unique angular orientation and flip-chip contact pad registration is demonstrated. Comparing the present invention concepts with prior art, there are a number of fundamental differences. The present invention does not require trapezoidal chips to prevent upside down assembly and asymmetric L or T shaped chip designs for angular orientation control. Instead, simple shapes or openings are used in combination with solder coated areas that can be activated to enable flip-chip assembly with unique angular orientation and contact pad registration. The pedestals surround the solder based receptor partially and define openings that are bigger than the components. The pedestals act as guides or chaperones for the solder directed self-assembly process to take place. The solder drives the assembly into the aligned stable position and the driving force is surface tension, as opposed to gravity. Design rules can be established to achieve assembly with unique angular orientation of conventional die forms that do not have an asymmetric three dimensional L or T shape. The technology demonstration is the programmed assembly of conventional die forms with single angular orientation of more than one component type on the same substrate, electrical connectivity, and contact pad registration. Agitated components in a heated ethylene glycol solution attach to the solder coated areas only after a correct angular pre-orientation condition is met. In one experiment, the directed assembly of one hundred silicon blocks, 900 and 500 micrometers in size, was performed with 19 micrometer lateral and 0.3 degree angular contact pad registration accuracy.

A3. Accelerated Assembly Using Concentrated Component Delivery

A new system employing a liquid-liquid interface is described to deliver and concentrate components (e.g., dies, chips, chiplets) with correct pre-orientation. This aspect of the invention can provide the successful assembly of 20 μm sized components that are one order of magnitude smaller than what has been possible so far.

A4. Flip-Chip Transfer of Redistributed Components onto a Target Substrate that is Different from the Self-Assembly Substrate Another embodiment of the invention relates to an extension of the self-assembly technology. This embodiment can be used to modify current chiplet transfer technology, which has been used as a means to transfer semiconducting materials and chiplets from one substrate to another, to allow for the redistribution of components to achieve a new orientation or pitch. In one embodiment, the programmed self-assembly is used as a technology module that can be incorporated prior any transfer solution to redistribute components with new orientation and pitch. This embodiment allows for parallel redistribution and reordering of components to be performed prior to flip-chip transfer onto a final substrate that is different from the self-assembly substrate.

B: Experimental Detail and Results

B1. Programmable Assembly—Details and Results

Figure 1B:
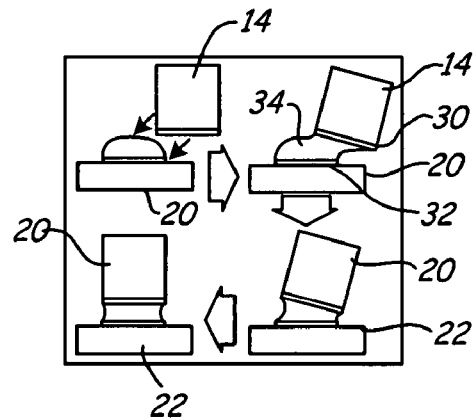
FIG. 1B shows four steps in the self-assembly of FIG. 1A.
Figure 2:
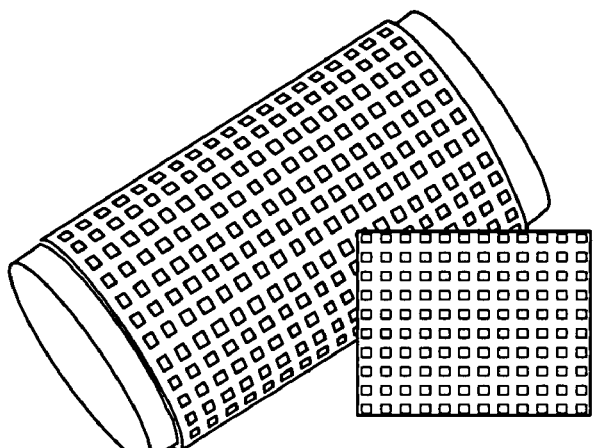
FIG. 2 is a perspective view showing a substrate self-assembled with components in accordance with FIGS. 1A and 1B.

The basic principle of the liquid-solder-receptor-directed assembly process is illustrated in FIGS. 1A and 1B. FIG. 1A is a perspective view of an assembly system 10 in accordance with the present invention which includes a container 12 configured to contain a plurality of components 14 and a fluid such as water. A substrate 20 with a plurality of activation sites 22 is also carried in the container. A motorized system 24 is configured for moving the container, for example in a tumbling fashion. FIG. 1B shows assembly steps in accordance with the invention as a component 14. As illustrated in FIG. 1B, the component 14 includes a metalization layer 30 and the substrate 20 includes a metalization site 32 which can be activated by a heater or the like and a layer of solder 34 deposited on the heater. Only the substrate presents solder sites and no solder is present on the components. This differs from techniques that use pairs of molten solder sites resulting in chaining and formation of large 3D aggregates. One side of the component is coated with a metal contact. This metal contact wets and binds to liquid-solder-based-receptors during the self-assembly process at a temperature where the solder is molten. The minimization of the free surface area of the liquid solder drives the assembly into a stable, aligned position. The assembly of large number of identical components has been accomplished using this process. FIG. 2 illustrates results where ~1500 silicon segments were assembled with a size of 300 μm onto a flexible surface in 3 minutes.

Figure 3A:
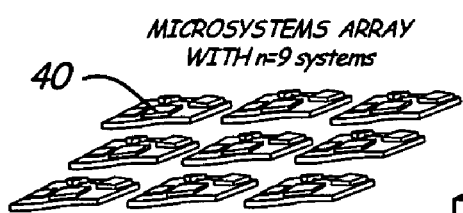
FIGS. 3A, 3B and 3C are perspective views showing self-assembly of components.
Figure 3B:
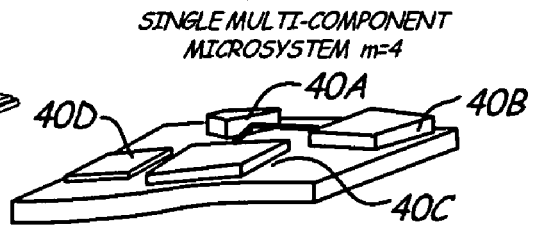
Figure 3C:
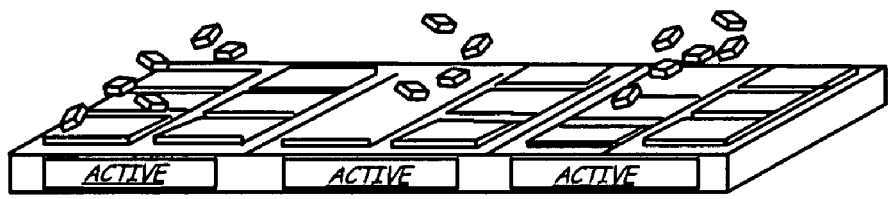
Figure 4:
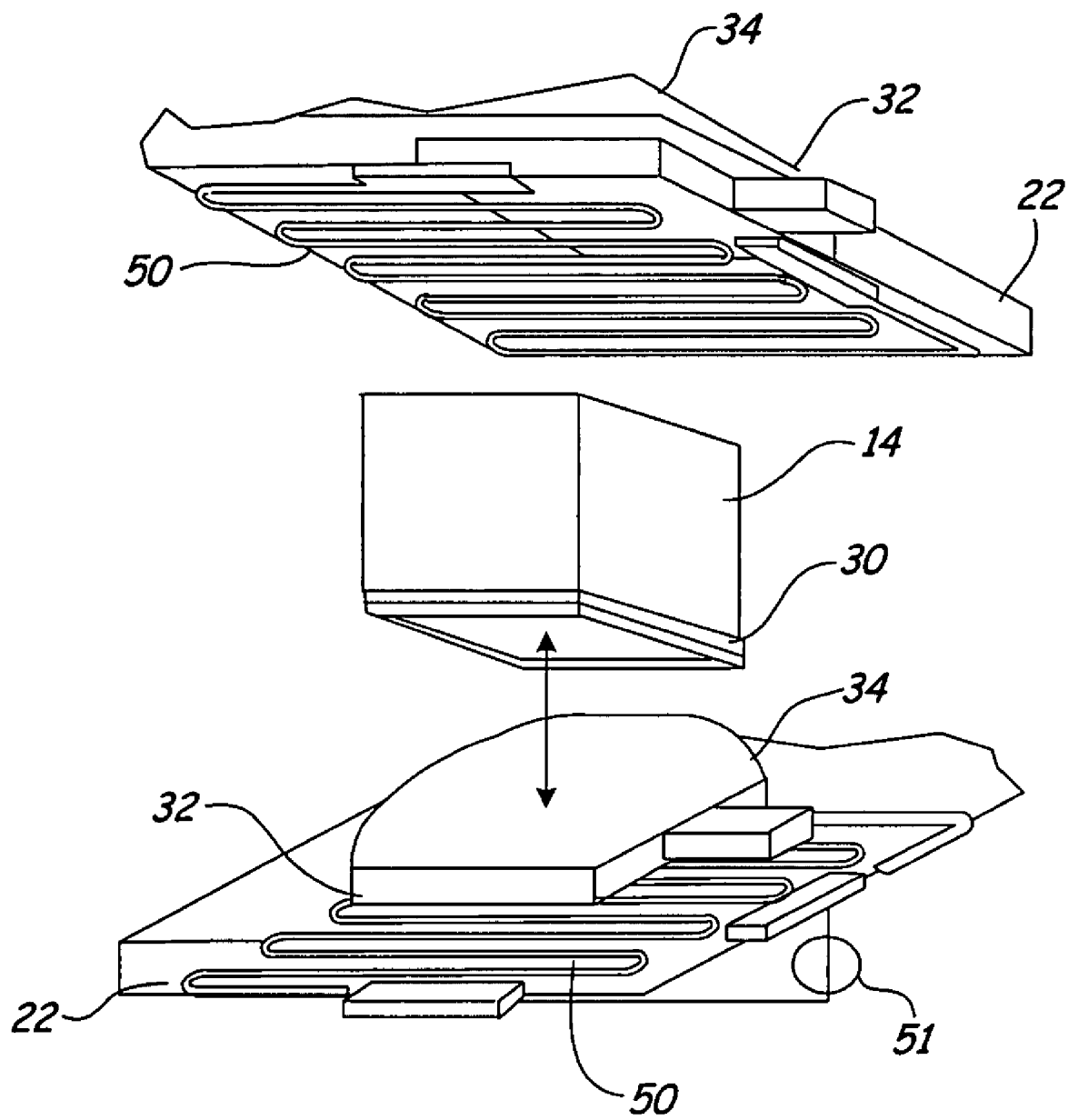
FIG. 4 is a perspective view showing substrates and a component arrangement for self-assembly.

The basic concept of a parallel high-throughput heterogeneous self-assembly line is illustrated in FIGS. 3A-C. This embodiment employs a well defined sequence rather than assembling all of components in a single step. The illustration shows a 3×3 microsystem array 40, each of which contains four different components 40A, 40B, 40C and 40D. The system is assembled by sequentially activating selected receptor sites. The activation of the receptors enables the programmable batch transfer of desired components onto desired locations. One technique to activate the selected receptor sites is illustrated in FIG. 4. This technique makes use of heaters 50 that are integrated on the back side of a flexible substrate that supports the solder-coated areas. A voltage source 51 is configured to apply a voltage, and resulted current, through heater 50 to thereby case heaters 50 to increase in temperature and melt the solder 34. The self-assembly of the components occurs due to the reduction of the interfacial free energy. Components that are suspended in a solution that carry Cu-coated binding sites attach to solder coated areas that are heated above the melting point of the solder.

To evaluate the feasibility of the PRS concept, computer simulations were performed using ANSYS to estimate: (i) the necessary power to heat selected receptors to above the melting point of the solder, (ii) the minimal spacing between receptors for preventing thermal crosstalk, and (iii) the effect of the liquid flow in the agitated assembly solution. The substrate used for the simulation was a 20 μm think-polyimide film with heaters on the backside. A melting point of 90° C. of the solder was used. The solder based receptor was considered to be activated "ON" in surface regions where the local temperature was larger 90° C. and considered to be non-active "OFF" in regions where the temperature was smaller 80° C. The boundary condition of our simulation was a 10 mm wide, 10 mm deep and 10 mm tall channel with a fixed 20° C. temperature at the top. Without flow, a fixed temperature (20° C.) boundary condition was used for the side walls. Under flow, an incoming flow that had a temperature 20° C. at the flow rate of 0.1 m/s was used.

Figure 5A:
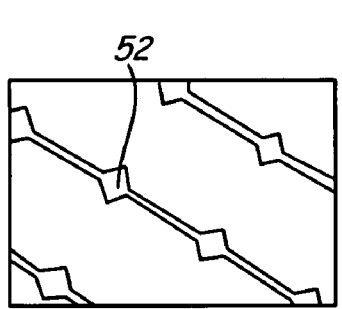
FIGS. 5A, 5B and 5C are plan views of a substrate during a self-assembly process.
Figure 5B:
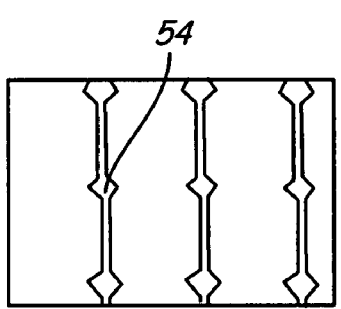
Figure 5C:
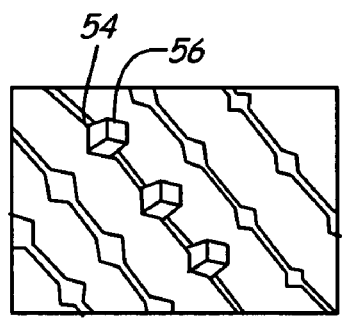

FIGS. 5A, 5B and 5C show the concept of programming the solder sites by using local electrochemistry. Local electrochemistry is applied to sequentially deposit solder onto the surface. Subsequent self-assembly occurs only at the areas that carry the solder. The solder that has been used in this illustration has been InSn that provides a melting point (118° C.; far below from the boiling point of solution; Ethylene Glycole). FIG. 5A shows sequential electrodeposition in InSn solder on selected areas 52 to form functional receptors 54 (5B) after a reflow at elevated temperatures. FIG. 5C shows subsequent self-assembly of 300 um sized silicon blocks 56 onto the solder coated areas 52. The process can be repeated to batch assembly components (e.g., dies, chips, chiplets) in other areas by repeating this sequence.

Figure 6A:
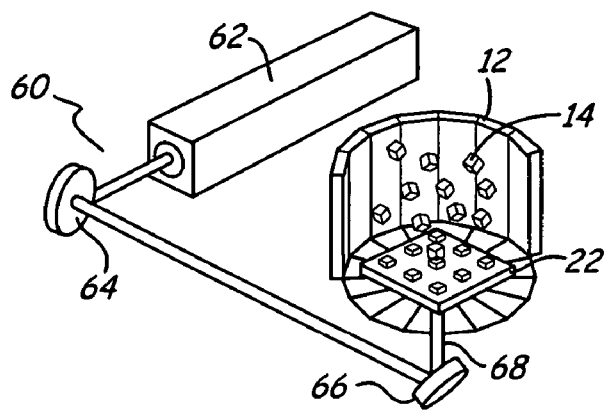
FIG. 6A is a perspective view of a system using a laser to selectively heat receptive sites for programmable self-assembly.
Figure 6B:
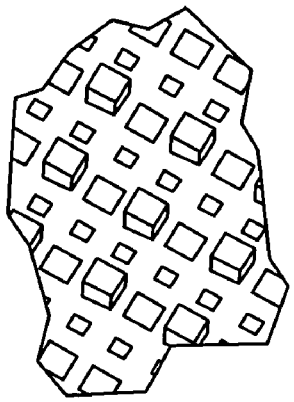
FIG. 6B is a perspective view of a substrate including self-assembled components in accordance with the process illustrated in FIG. 6A.
Figures 7A, 7B, 7C, 7D, 7E, 7F:
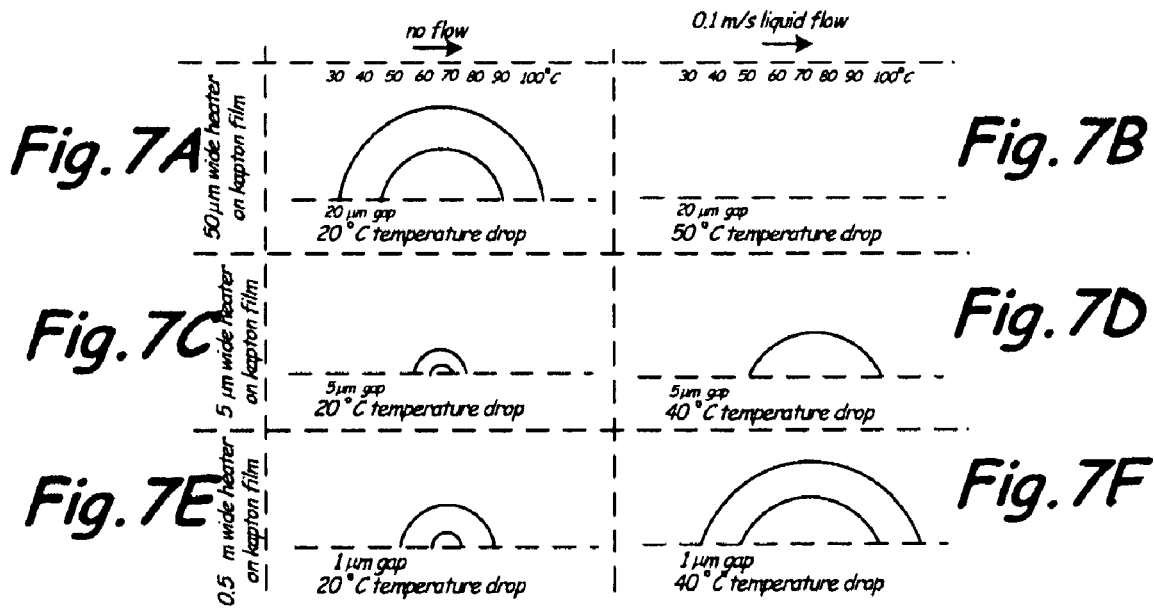
FIGS. 7A, 7B, 7C, 7D, 7E and 7F are graphs showing the results of no flow and flow conditions for temperature distributions for various heater configurations.

FIG. 6A depicts another system 60 to accomplish the activation of the solder sites using a scanning laser system. In FIG. 6A, programmable self-assembly is accomplished by (A) sequential heating the solder sites using a scanning laser 62. Scanning laser 62 is illustrated as including two servo mirrors 64 and 66 which are used to change the direction of laser beam 68. Beam 68 is directed at substrate 22 which is in accordance with techniques described above and carried in container 12 along with a liquid and nano components (e.g., dies, chips, chiplets) 14. FIG. 6B shows actual results where the components have been successfully assembled onto activated solder sites. In contrast to FIGS. 4 and 5 this embodiment does not require electrical contacts to activate the sites. The process can be repeated continuously to assembly components in other areas. Photochemical activation of the solder sites by masking the sites with a photochemical layer (e.g. photoresist) is an example extension that would use a similar instrumentation. The scanning laser could also be replaced with a parallel light projection system such as the ones used in today's projection system particular if a photochemical route involving a photoresist is implemented to mask receptor sites.

FIGS. 7A-7F depict the temperature profile with and without flow around differently sized receptors. The thermal coupling between receptors occurs through a 20 μm thick polyimide substrate, the liquid, and the liquid flow. The temperature distributions are around 50 μm, 5 μm and 0.5 μm wide heaters on a Kapton polyimide film with and without liquid flow. The computer generated power levels are in good agreement with the analytically calculated power that is required to heat a half sphere that is supported on thermally insulating film with no thermal losses to the substrate. The equations and results for the half sphere are summarized in FIG. 8 which shows temperature and power for a hemispherical receptor. Both the simulation and analytical first order estimates show that receptors can be closely spaced to each other. The maximum required spacing for a system with little or no liquid flow to maintain a 20° C. temperature drop is 20 μm, 5 μm, and 1 μm for 50 μm, 5 μm, and 0.5 μm sized receptors, respectively.

The simulation also suggests that even higher integration might be possible in assembly systems that use a liquid flow for component transport and assembly. The required heating power, however, would go up.

FIG. 7: Temperature distributions around 50 μm, 5 μm and 0.5 μm wide heaters on a Kapton polyimide film with and without liquid flow.

Figure 8:
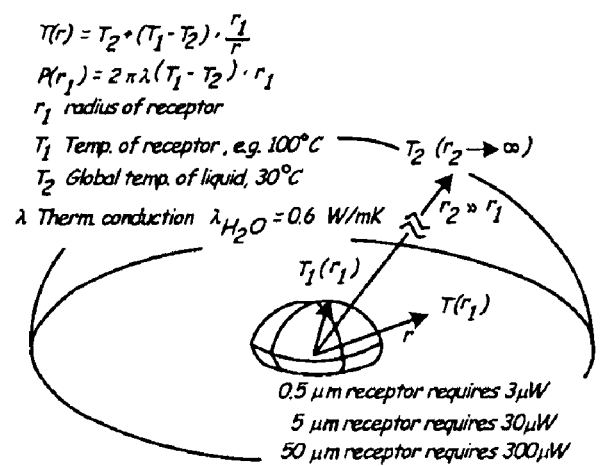
FIG. 8 illustrates temperature and power for a hemispherical receptor.

FIG. 8: Temperature and power for a hemispherical receptor.

Figure 9A:
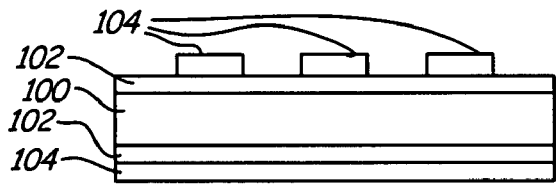
FIGS. 9A, 9B, 9C, 9D, 9E, 9F and 9G illustrate steps in fabricating a substrate for use in a self-assembly process in accordance with the present invention.
Figure 9B:
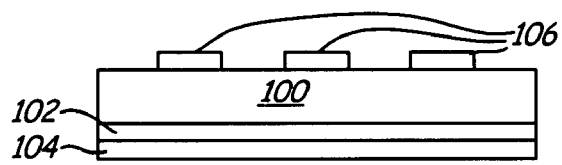
Figure 9C:
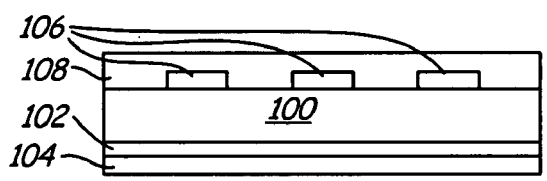
Figure 9D:
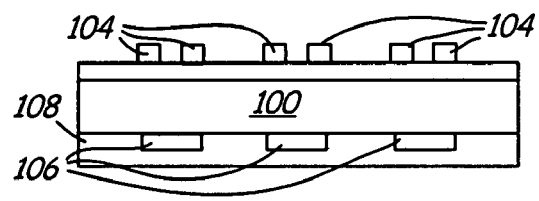
Figure 9E:
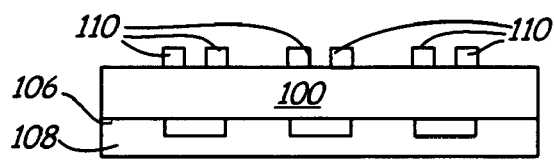
Figure 9F:
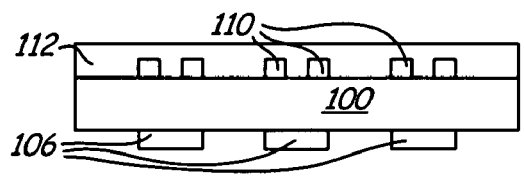
Figure 9G:
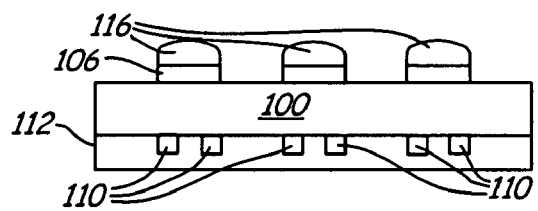

Substrates were fabricated to experimentally test the feasibility of PRS. The fabrication process is illustrated in FIGS. 9A-9G which are cross-sectional views. In FIG. 9A, a substrate 100 of a polyimide film is used and coated with copper layers 102. A photoresist layer 104 is patterned on one side of the substrate 100. Next, the copper is etched, as illustrated in FIG. 9B, to leave receptor sites 106. A protective layer of photoresist 108 is deposited on top of receptor sites 106 as illustrated in FIG. 9C. Next, as illustrated in FIG. 9D, the backside of the substrate 100 is patterned using the photoresist 104. Next, the copper is etched as illustrated in FIG. 9E leaving heater elements 110. The protective overlayer photoresist 108 is then etched as illustrated in FIG. 9F and a PDMS coating 112 is applied over the heater elements 110. Finally, as illustrated in FIG. 9G, a layer of solder 116 is deposited on the activation sites 106.

As a substrate material, a polyimide film that has a copper cladding on both sides was used (Pyralux LF7022R, Dupont, Wilmington, Del.). The polyimide film is appropriate to our application since it is robust, flexible, thermally stable up to 350° C., and compatible with standard micro-fabrication processes. During the process we supported the flexible polyimide film on a polydimethylsiloxane (PDMS)-coated silicon wafer. First, Shipley 1818 photoresist (Microposit, Phoenix, Ariz.) was spin-coated on the backside of polyimide film at 3000 rpm for 30 sec and baked at 105° C. for 2 minutes to protect the back during the processing of the fort side. Shipley 1813 photoresist (Microposit, Phoenix, Ariz.) was spin-coated at 3000 rpm for 30 sec on the front of the substrate. After a soft bake at 105° C. for 1 minute, the substrate was exposed to UV light through a dark field mask and developed in developer 1 MIF-351: 5 $H_2O$ for 15 seconds. The exposed copper area was etched by aqueous ferric chloride solution (1.4 g of $FeCl_3$ per milliliter of $H_2O$, pH 1.3). Shipley 1818 photoresist was spin-coated and cured to protect the patterned front side during the processing of the back side. The polyimide film was peeled off and remounted upside down on the PDMS coated silicon wafer. The same photolithography and etching sequence was applied to the copper cladding on the back of the polyimide film to define the heater array on the other side. In addition to this process a 150 μm thick layer of PDMS was applied on the heater side using spin-coating at 500 rpm during 30 seconds and cured in a convection oven for 1 hour. This PDMS layer was used as a thermal insulator for the heaters and as a mask to prevent solder wetting on the back side. Finally, the defined receptors were coated with solder by dipping the substrate into a liquid solder bath.

The PRS was tested with a meander type heater array. The self-assembly was performed in a small vial filled with DI water. The DI water was made slightly acidic (pH 2.5) with sulfuric acid to remove metal oxides from the surface of the solder and copper binding sites. A solder mp 47° C., LMA-117, Small Parts, Miami Lakes, Fla. was used. During the assembly process, the vial was agitated by hand until each activated receptor captured one component. A voltage of 0.34V and a current of 0.87 A was applied to heat the three meander type heaters that were connected in series. The power to obtain a local temperature increase $\Delta T$ of 50° C. using an equation for a hemi-cylindrical line type heater was estimated:

$$P = \frac{\pi/\lambda \Delta T}{\ln(r_2/r_1)} \qquad \text{EQ. 1}$$

We obtained 289 mW for our 150 μm wide ($r_1$=150 μm) and 15 mm long (l=15 mm) heater that is located 2 mm away ($r_2$=2 mm) from the heat sink, which is in good agreement with the measured 296 mW.

To demonstrate the integration of components at a pitch that is twice the components size we used a linear copper metal layer was used as heaters—300 μm wide and 20 μm thick—on the back side of the polyimide films. The assembly resulted in an M-shaped pattern that includes two different CMOS device surrogates—300 μm×300 μm and 500 μm×500 μm wide silicon blocks—that have been assembled on a curved surface. The 300 μm sized silicon device surrogates self-assembled onto 300 μm sized receptors with the heater H1 being switched "ON", whereas the 500 μm sized components self-assembled onto 500 μm sized receptors with the heaters H2 being switched "ON". 300 μm sized GaP-based light-emitting-diodes (LED) and silicon chips that have also been assembled as programmed by the underlying heaters.

In one experiment, heterogeneous self-assembly was programmed using meander type heaters that are integrated on the back side of the flexible polyimide printed circuit board material. 500 μm wide silicon device surrogates, 300 μm wide GaAs light emitting diodes, and 450 μm wide silicon device surrogates that were 600 μm tall were assembled. The components self-assembly in a three step sequence onto activated receptor sites.

In another example, heterogeneous self-assembly was programmed using linear heaters. The linear heater circuit is located on the back side of a flexible and translucent polyimide printed circuit board material that is wrapped around a glass cylinder. 500 and 300 μm wide silicon device surrogates were transferred onto heated surface areas, 280 μm wide GaAs LEDs and 300 μm silicon blocks were batch assembled onto the corresponding surface areas in a two-step self-assembly sequence for a total of 196 device segments are visible. Three different LED types—a total of 360 LEDs—were assembled in three successive steps without defects. A 50 μm wide metal wire on the front of the polyimide film connects the different device components to contact pads.

Figure 3D:
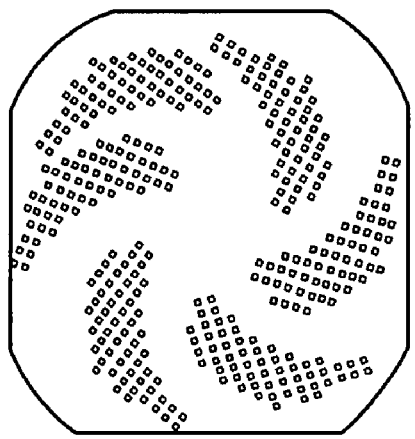
FIG. 3D provides top and magnified views of a heterogeneous and color display segment formed in accordance with embodiments of the invention.
Figure 3D:
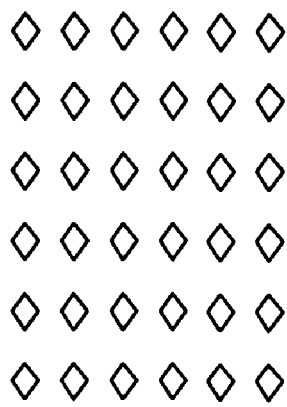

In another example, different color LEDs were assembled onto a polyimide film using a programmable linear heater array. The 280 μm×280 μm sized GaAlAs/GaAs, GaP/GaP, and GaP/GaAsP LED dies (Knowledge On Inc., Korea) were transferred onto the activated receptors in three successive self-assembly steps. Each self-assembly step took 5 minutes. After the self-assembly had been completed a copper polyimide top electrode was applied to form a functional device, which is illustrated in FIG. 3D. The top copper electrodes were fabricated using the same lithographic process that was used to fabricate the receptors and heaters. To test the functionality of the LEDs, we applied a potential of 2 V between the top and substrate electrodes. A 6×6 array contains three types of LEDs with different colors; each type represents a 2/6 array. The addressable LED array is connected using interdigitated electrodes.

In general, three types of defects appeared: (i) empty receptors, (ii) receptor that captured two devices, and (iii) receptors that captured the wrong device due to thermal crosstalk. The first two defects observed were not inherent to the assembly process itself, but were caused by imperfections in both the receptors and the device segments. The first two types of defects were removed by increasing the level of agitation and by selecting components and materials that were free of manufacturing defects. The last defect type was removed by maintaining a pitch that is at least twice the components size. A minimum size of components has not yet been established that can be assembled without defects, or the ultimate level of perfection that can be achieved as function of assembly time and component density.

In this aspect, a self-assembly process that can enable massive heterogeneous integration of components on planar or non-planar surfaces is provided. The outlined method has a number of advantages over existing self-assembly concepts and could be used to assemble many heterogeneous systems that require electrical interconnects. The self-assembly also becomes reconfigurable, i.e. the user can make changes by changing the location of activated receptors without fabricating a new receptor array. For example a matrix array could be used to program any desired configuration. The concept could also be combined with other sequential self-assembly methods that form three-dimensionally shaped Microsystems.

B2: Assembly of Conventional Die-Forms with Unique Angular Orientation

The technology as it has been described above can be used with components with a square shaped binding side self-assembled onto a square shaped receptor with four stable angular orientations 0, 90, 180, and 270°.

In another aspect, a unique solution is provided to control angular orientation and contact pad registration during the self-assembly process. This embodiment can be used to eliminate the 90, 180, and 270° angular orientation as well as to enable flip chip assembly with contact pad registration forming multiple input output terminals between the component and the substrate. This aspect of the invention is an extension of above discussion related to surface tension directed self-assembly involving liquid solder to form interconnects and is compatible with these processes. Angular orientation control can be important because dies, packaging, or optical elements need to be placed on a substrate with correct angular orientation to enable contact pad registration or device operation. Angular orientation control has been challenging in self-assembly. For example, a component with a square shaped binding side self-assembles onto a square shaped receptor with four stable angular orientations 0, 90, 180, and 270°. While specific designs in the shape of the receptors and binding sites have been tested to favor one orientation over the other, the removal of defects due to local energy minima and partial overlap between receptors and binding sites remain unsolved. The self-assembly process is configured such that it would be open to typical die forms to overcome the limitations of some self-assembly processes that require very specific die geometries—L shaped blocks for angular orientation and trapezoids to prevent up-side down assembly—that are not common in the microelectronics industry; most dies are square in shape. One aspect of this self-assembly process are "two-element docking sites" on the substrate that contain alignment pedestals (out of silicon, photoresist, or other material) and solder-coated areas commonly used in printed circuit boards. The two elements—alignment pedestals and solder-coated areas—are designed according to the size and shape of the components, in particular the location and shape of the contact pads. The angular alignment capability is achieved as a result of the combination of these two elements. During the self-assembly process the agitated components attach to the solder coated areas only after a correct angular pre-orientation condition is met. Components that have been tested include standard silicon dies and glass components. Arrays containing one hundred identical components as well as a mix of two components (900 and 500 μm in size) were prepared using the procedure. First design rules have been identified to accomplish self-assembly with an angular orientation accuracy of 0.3° and filling factors of 100%.

One strategy to assemble and connect components on surfaces with single angular orientation and contact pad registration is illustrated in FIG. 10. The system 150 shown in FIG. 10 includes substrates 152 each having U-shaped mounting pedestals 154. Components 156 are shown adjacent to substrates 152. The components 156 contain a partially offset binding area, for example as a metal such as gold 158. The partially offset binding site is arranged to bind with partially offset solder 159 which is positioned within the alignment pedestal 154. The components 156 are integrated on a substrate using solder coated 158 areas that are partially surrounded with raised u-shaped alignment pedestals 154. The components can only attach to the solder coated areas 159 if a correct angular pre-orientation condition is met: components 156 that arrive at the docking sites with an angular orientation that deviates by more than ±90° from the desired orientation will not find a sufficient overlap between the binding site 158 (contact area) on the components 156 and the solder coated areas 159 on the substrate 152 and not attach; other components will be captured and aligned due to the reduction of the interfacial free energy.

Figure 10A:
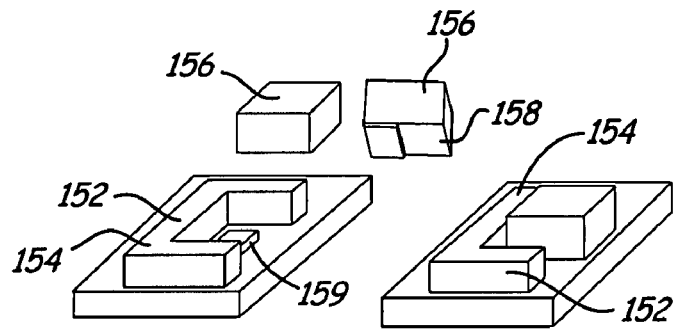
FIGS. 10A, 10B, 10C, 10D and 10E are perspective views illustrating self-assembly of components into shaped receptor sites on a substrate in accordance with one embodiment of the invention.
Figure 10B:
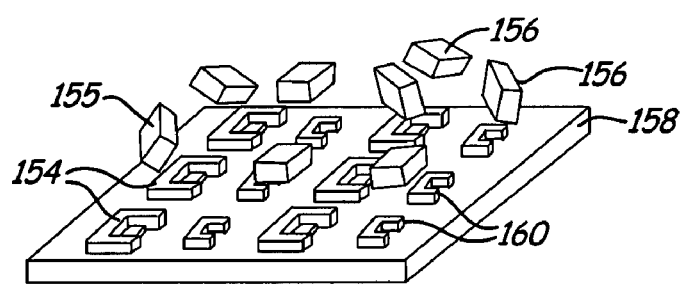
Figure 10C:
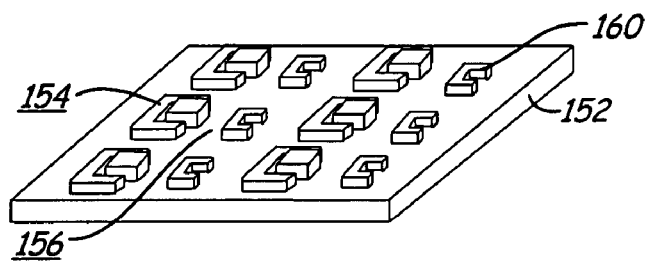
Figure 10D:
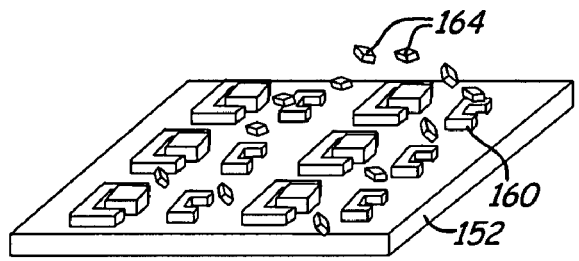
Figure 10E:
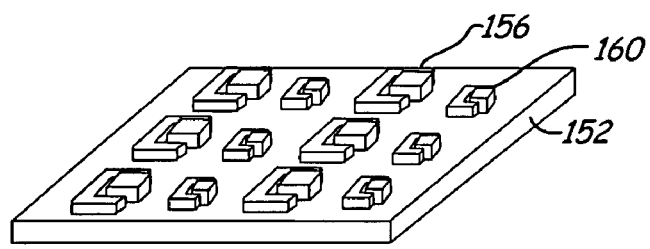
Figure 10F:
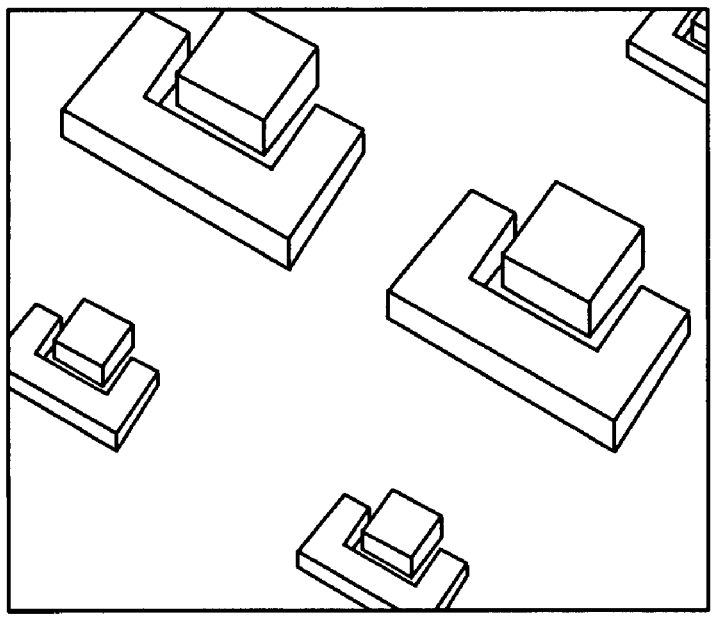
FIG. 10F includes perspective views of a substrate including self-assembled components in accordance with the processes illustrated in FIGS. 10B-E.
Figure 10F:
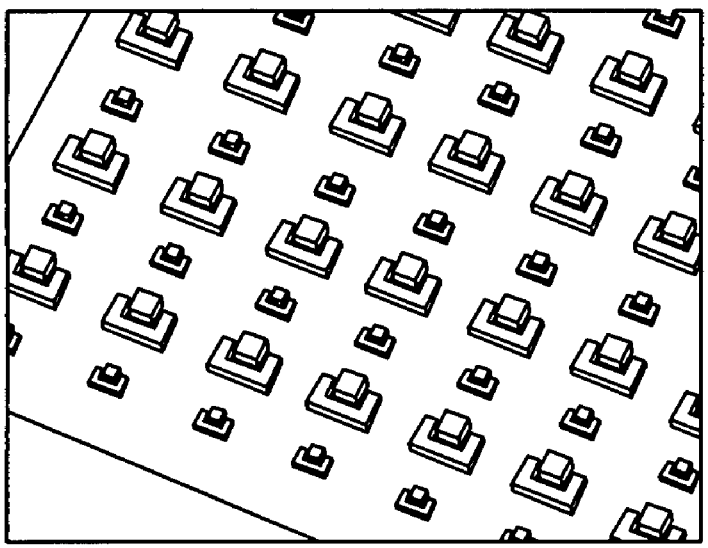

FIGS. 10B-10E show perspective views of steps in accordance with a further example. In this configuration, a second set of U-shaped 30 alignment pedestals 160 are provided on the substrate 152. First, components 156 are assembled as described above. Next, as illustrated in FIG. 10D, a second component 164 is provided and arranged to align with pedestals 160. The completed assembly is shown in FIG. 10E which both components 160 and 156 have been assembled onto the substrate 152. FIG. 10F includes perspective views of a substrate including self-assembled components in accordance with the processes illustrated in FIGS. 10B-E.

For example, silicon dies that carry rectangular gold coated areas on the back are used with square shaped contacts and alignment marks on the front. The outlined procedure provides the sequential batch assembly for silicon components with different dimensions. Sequential batch assembly of 900×900×500 μm sized silicon dies in the first self-assembly step and 500×500×500 μm in the second were tested. Aside from the depicted components that carry a single contact on the back, one directed assembly strategy used glass components that carried seven contacts on one face and the assembly of these components at designated areas on a surface using a "flip-chip" orientation. The procedures to fabricate the silicon, glass components, pedestals, and solder coated areas are described herein. During the self-assembly the surface of the liquid solder wets and binds to the gold coated contact on the back side of the dies. Energy minimization drives the assembly into a stable single angular orientation. The solder also provides the mechanical bond required to hold the assembly together. Both low (mp. 47° C.) and medium (mp. 138° C.) melting point solders (Y-LMA-117 and LMA-281, Small Parts, Miami Lakes, Fla.) were used. No notable difference between the two were observed. The assembly was performed in a glass beaker (100 mm in diameter) that was filled with ethylene glycol at a temperature of 150° C. where the solder was molten. Ethylene glycol was used to accommodate the higher melting point solder which is not compatible with a water based assembly solution and because it prevents the formation of trapped air bubbles in recessed areas. The ethylene glycol solution was made slightly acidic (pH ~2.5) with sulfuric acid to remove metal oxide from the surface of the solder drop; an oxide layer—if sufficiently thick—blocked the wetting of the metal surface. Component transport and mixing was provided by hand using a constant horizontal orbital motion while tilting the beaker up and down such the components tumbled randomly across the surface; the component transport method needs to be automated in future work using a fluidic conveyor belt type system.

The result of batch assembled silicon components with single angular orientation and contact pad registration using both the silicon and SU-8 alignment pedestals were examined. The results show a two component 10×10 array that contains 900 μm and 500 μm sized dies that have been assembled using the two-step self-assembly sequence while the lower half shows a single component 10×10 array that was used to determine the alignment accuracy. The alignment was measured for the entire array using a set of top view SEM micrographs—that were overlaid with a grid of squares that had a constant pitch and angular orientation. The required displacement and rotation of the overlaid squares to match the actual assembly was measure using AutoCAD. A systematic error of 0.8° in the angular orientation that resulted from an angular misalignment error that was made by the operator during the dicing of the dies was found. A shift towards positive values was visible in the histogram for a angular orientation. The accuracy of the self-assembly process was determined using the standard deviation which was 0.3° for the angular orientation and 19 μm for lateral accuracy. The recorded values were limited by the accuracy of the dicing saw (grit size 15 μm, Disco DAD 2H/6T, Disco, Santa Clara, Calif.) and may be improved if higher precision components are used. These self-assembly experiments were performed a number of times and it was found that use excess dies in the assembly solution were required. Without excess dies it was not possible to completely populate the substrate using the random motion. Excess dies can be recycled between experiments. Complete coverage of the respective receptors was accomplished in 5 minutes and 3 minutes.

It was observed that the width, length, and height of the alignment pedestals were important parameters that affected the assembly process and yield. One approach is to design self-assembly systems with CAD designs of the components that are planned to self-assemble and that have the same proportions than the actual design. The components are rendered semitransparent and are arranged in the CAD tool to find different conformation that have an overlap with the binding site that represents and energy minimum and potential defect. A number of CAD design iterations can be performed before manufacturing the components. For example, without alignment pedestals four angular orientations 0°, 90°, 180°, and 270° are apparent, which are evenly populated for square shape receptor/binding sites, while they favor two orientations for rectangular designs. The two fold symmetry is sufficiently disturbed for a two-to-one side lengths ratio which favors the 0° and 180° angular orientation. The 90° and 270° were not recorded experimentally unless two components assembled onto a single receptor at the same time which occurred in less than 2% of the cases; this defect (a3) was correctly predicted during the design. The results without alignment pedestals were consistent with other asymmetric binding site/receptor designs (triangles, L shapes, spiral type drops) that generally favor one orientations but fail to completely remove defects due to local energy minima in the space of possible conformations. Introducing the alignment pedestals is effective in removing such defects. One pedestal along the elongated side is sufficient to obtain the correct angular orientation in >98% of the cases. As a design rule, the clearance h1 between the solder and alignment pedestal should to be equal or smaller than the distance h2 between the binding site (metal contact) and center line on the component to prevent partial overlap for the 180° angular orientation. For example, h1=h2=50 μm in one design to leave clearance for the components to adjust their position. The adhesion is proportional to the size of the contact area. The adhesion was sufficient if the sum of the participating contacts occupies at least 30% of the rectangular cross-section of the component; below this limit components detach during the self-assembly. Adding alignment pedestals on the side of the solder coated area with an opening w that is smaller than twice the component size and larger than the diagonal length of the components such that the components can rotate freely yielded defect free assemblies in all cases. Within this permissible range a bigger widths allowed a slightly fast assembly rate. The last parameter was the length l of the pedestal opening. This parameter was not critical in terms of yield but did influence the assembly speed. The reduction in length reduced the assembly time from 5 minutes to 3 minutes while it maintaining a 100% yield.

The self-assembly and design strategy can be extended to the flip-chip assembly of components and dies that carry more than one contact. For example, glass components were used that were made from borofloat glass wafers (Universitywafer, Boston, Mass.). Each component had seven gold contact pads, two on the left, and five on the right. Five contacts were coated with a highmp solder (Y-LMA-281, mp 138° C., Small Parts, Miami Lakes, Fla.) and protected with photoresist to prevent misorientation during the self-assembly. Each docking site contained two corresponding gold contacts carrying a low-mp solder (Y-LMA-117, mp 47° C. Small Parts, Miami Lakes, Fla.) and five gold contacts connecting with the gold wires on the substrate. The low-mp solder is used to drive the assembly and to ensure correct angular orientation during the self-assembly. The assembly was performed in ethylene glycol at a temperature of 100° C. instead of 150° C. that was used for the earlier experiments described above. After completion of the self-assembly the entire structure was heated to 150° C. to establish the seven contacts. Electrical connectivity with a contact resistance of less than 2 ohms was confirmed in all cases. Alternatively, the high-mp solder could be integrated on the substrate instead of components.

The directed self-assembly of micro components with single angular orientation accuracy of 0.3° and contact pad registration with an accuracy of 19 μm for 500 μm—2 mm size components by adding a simple alignment pedestals by introducing alignment pedestals and contact pad layouts with increasing complexity is illustrated in FIG. 11. FIGS. 11A, 11B and 11C show perspective views of steps in accordance with various configurations of the invention. In FIG. 11A, a component 200 carrying a metal contact area 202 is deposited onto a substrate 204 and bonds to solder 206. The configurations of 11B is similar, however, an alignment well 207 is provided to help orient the component 200. In the configuration of FIG. 11C, the component includes a plurality of metalization areas 208 which can be used, for example, as electrical contacts and bond to a plurality of solder regions 214 on substrates 204. An alignment pedestal 214 having a U-shape using the techniques discussed above it configured to ensure proper alignment between metal regions 208 and solder regions 214.

Figure 11C:
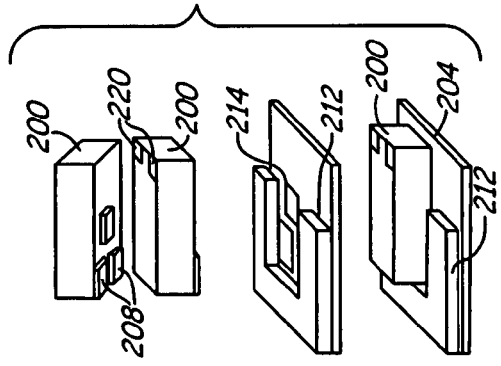
FIGS. 11A, 11B and 11C illustrate self-assembly using substrate having differently configured receptor sites.
Figure 11B:
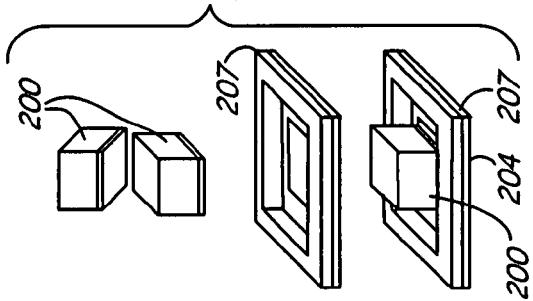
Figure 11A:
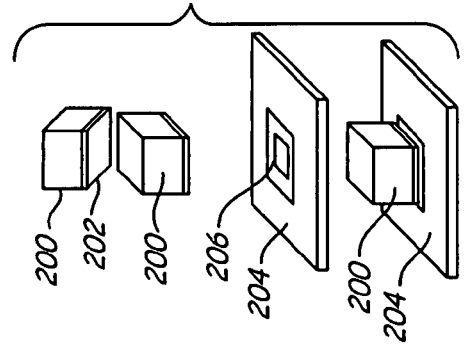
Figure 11D:
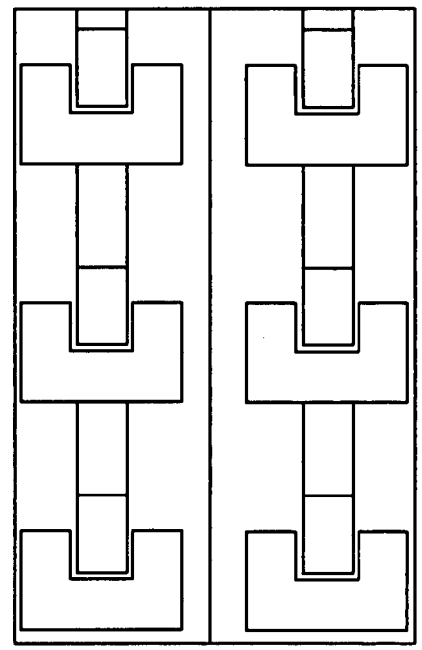
FIG. 11D is a magnified view of self-assembled components in accordance with the process illustrated in FIG. 11C.

The configuration shown in FIG. 11B prevents assembly of more than one component type onto a single receptor, while the configuration in FIG. 11C enables flip-chip assembly with single angular orientation and contact pad registration forming multiple contacts to the device; components can only attach to the solder-coated areas if a correct angular pre-orientation condition is met: components that arrive at the docking sites with an angular orientation that deviates by more than ±90° from the desired orientation will not find a sufficient overlap between the binding site (contact area) on the components and the solder-coated areas and will not attach. Other components will be captured and align due to the reduction of the interfacial free energy. FIG. 11D is a magnified view of self-assembled components in accordance with the process illustrated in FIG. 11C. The ultimate complexity in terms of alignment accuracy, number of contacts, and density of interconnects that could be established by this process has not yet been established. First design rules have been established to enable batch transfer of differently sized components onto surface without defects. The graphical computer aided designs of the shapes and binding sites were found to be very efficient in predicting the outcome of the self-assembly as well as in identifying and eliminating potential defects. It is believed that combinatorial methods that combine geometrical shape recognition, surface tension, sequential self-assembly, and programmable self-assembly that activates receptors [15, 17, 20] are necessary to achieve the required flexibility in the design of heterogeneous systems on both the micro and nanometer length scale with minimal defects.

Figure 12A:
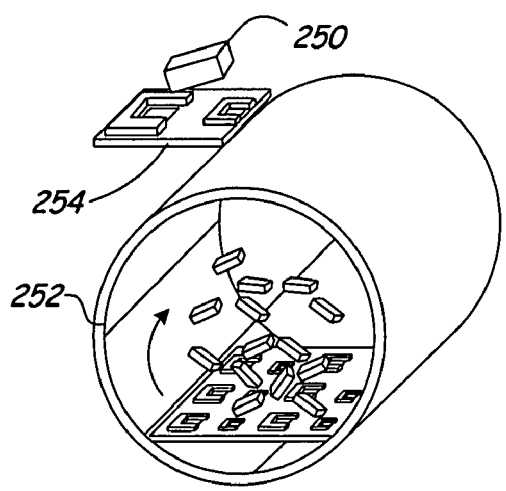
FIGS. 12A and 12B are perspective views of self-assembly process using shaped receptor sites in accordance with the invention.
Figure 12B:
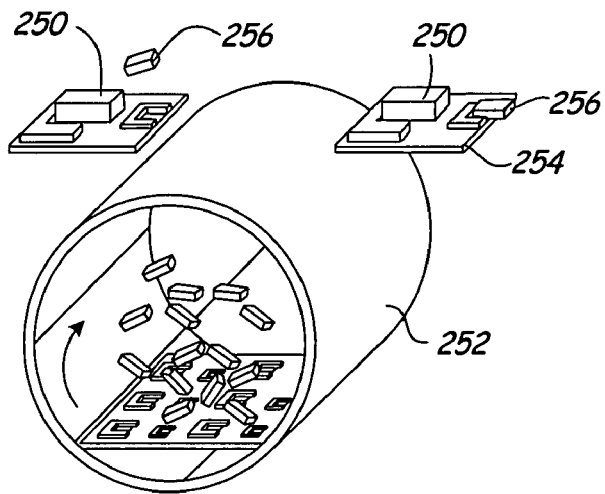

B3. Accelerated Assembly and Demonstrating Scalability Using Concentrated Component Delivery System The above discussion includes examples which were assembled with components that were suspended in solution. An accurate representation of the agitation procedure that was used to deliver the components is illustrated in FIGS. 12A-12B. In FIG. 12A, a first component 250 is tumbled in a container 252 and aligned with substrate 254 as discussed above. Fluid in the container 252 can comprise, for example, ethylene glycol. Next, in FIG. 12B, a second component 256 is provided which assembles onto the substrate 254 at a second location using the techniques discussed above. The assembly was performed in a glass vial that was filled with ethylene glycol at a temperature of 150° C. so the solder was molten. Ethylene glycol was used to accommodate the higher melting point solder that is not compatible with a water-based assembly solution. Both a low—(47° C.) and medium—(138° C.) melting-point (mp) solders (Y-LMA-117 and LMA-281, Small Parts, Miami Lakes, Fla.) were used. No notable difference between the two was observed. The ethylene glycol solution was made slightly acidic (pH ~4.0) with hydrochloric acid to remove metal oxide from the surface of the solder drop; an oxide layer that—if sufficiently thick—blocked the wetting of the metal surface. Component transport and mixing was provided by hand agitation of the vial/drum to accomplish a back and forth tumbling motion across the surface.

Solder directed self-assembly can be scaled down to much smaller component dimensions than this discussed above. The surface free energy of liquid solder dominates thermal energy and Brownian motion down to the sub-1 μm scale. One problem is a surface oxide may form due to residual oxygen, blocking the self-assembly. To combat this problem, small amounts of acid can be added (pH 2-4) to the assembly solution. The acid, however, leads to an oxidative dissolution of the solder an issue which becomes increasingly challenging as the solder volume is reduced.

Figure 13A:
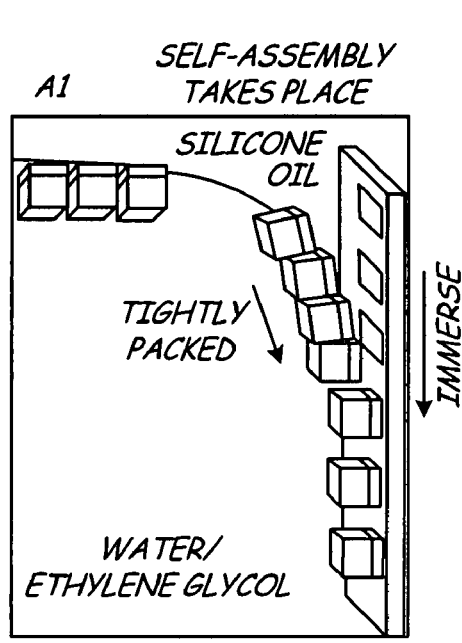
FIGS. 13A and 13B illustrate self-assembly steps using an interface between two liquids to carry components onto a substrate.
Figure 13B:
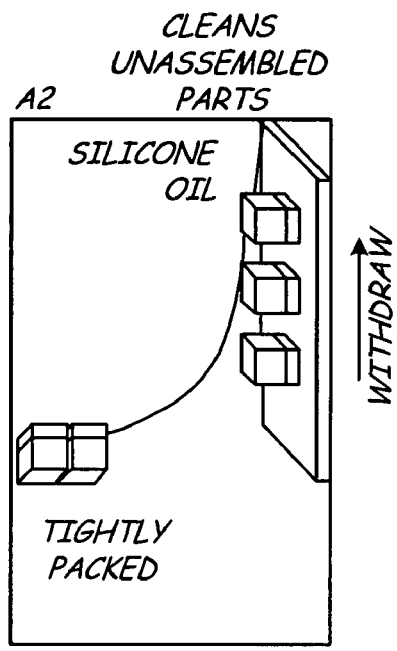

FIGS. 13A and 13B are perspective views showing another example configuration of the present invention. In this example, delivery of the components for self-assembly is achieved using an interface between two different fluids. In this example, a water/ethylene glycol solution forms an interface with silicon oil. The components tend to align along the interface and can be quickly deposited onto a substrate as the substrate moves relative to the interface. The assembly speed is increased and dissolution of the solder is limited. The components are injected into the silicon oil and settle at the oil/water interface. SU-8 and Si blocks were tested that were formed through etching carrying a single gold contact on one side. The components were plasma treated in an oxygen plasma prior to use and settled at the oil-water interface with the gold surface facing the oil phase and the remainder facing the water. There has been prior work on self-assembly at the liquid-liquid interface that used the static wetting angle between components to form sheets of stable structures that float at the interface. The illustrated concept is not directed at forming stable sheets or assemblies within this interface. The components only float at the interface and are concentrated due to the two dimensional nature of the sheet. One feature that is interesting that has not yet been explored is the use of the dynamic angle that forms at the interface between the liquid-liquid interface and the intersecting substrate. Contrary to the static contact angle the dynamic angle slopes downward as the sample is moved through the interface and the sheer velocity and viscosities determine the shape. As the substrate is immersed into the liquid, the angle changes dramatically resulting in a downward slope and components are delivered and concentrated in a thin surface layer. The components touch the solder sites and the self-assembly is driven by the liquid solder yielding a stable aligned orientation. Downward motion results in rapidly accelerated self-assembly. The illustrated results show 20 μm components that self-assembled after dipping the chiplets ~10 times into the solution. Withdrawing the sample (FIG. 19B) reverses the angle and effectively removes unassembled components.

A programmable reconfigurable liquid solder directed self-assembly (PRS) process is provided to enable heterogeneous integration of components on non-planar substrates. The process that is proposed makes use of solder-based receptors that can be activated electrically. Metal contacts on segmented semiconductor devices bind to liquid-solder-based-receptors on a substrate surface during the fluidic self-assembly. Programmability is implemented using solder-based receptors that can be switched "ON" and "OFF" using integrated heaters. The feasibility of the proposed PRS concept was evaluated through computer simulations using ANSYS to estimate: (i) the necessary power to heat selected receptors to above the melting point of the solder, (ii) the minimal spacing between receptors for preventing thermal crosstalk, and (iii) the effect of the liquid flow in the agitated assembly solution. A prototype substrate was fabricated to experimentally test the feasibility of PRS and successfully demonstrate the programmable assembly of multiple types of components onto target positions. Example components include differently sized silicon device surrogates, GaAlAs/GaAs, GaP/GaP, and GaP/GaAsP LEDs. The process makes use of sequentially activated receptors and provides a new concept to the parallel integration of micro and potentially nanoscale devices and systems that require electrical interconnects between components that are heterogeneous both in terms of materials and in terms of physical dimensions.

B4. Flip-Chip Transfer of Redistributed Components onto a Target Substrate that is Different from the Self-Assembly Substrate Chiplet transfer processes are used to transfer semiconducting materials and chiplets from one substrate to another. Some transfer solutions conserve the order on the donor wafer that was used to manufacture the components. Conserving the order on the donor wafer that originally hosts the components, however, has some important limitations. For example, such transfer solutions do not allow for the redistribution of chiplets (components) with new pitch and angular orientation on an individual chiplet basis and numbers that are different form the donor wafer respective numbers. The realization of heterogeneous integrated circuits containing a mix of circuits integrating chiplets ranging from sparse to densely populated areas will be impaired as a direct consequence, unless large portions of the donor wafer are left unused.

One aspect of the invention addresses the challenge of not being able to redistribute components. In one embodiment, the programmable self-assembly is incorporated to provide a complementary technology module. Embodiments of the described programmable self-assembly technology module provide the ability to redistribute components before they are transferred using a transfer solution.

Figure 14:
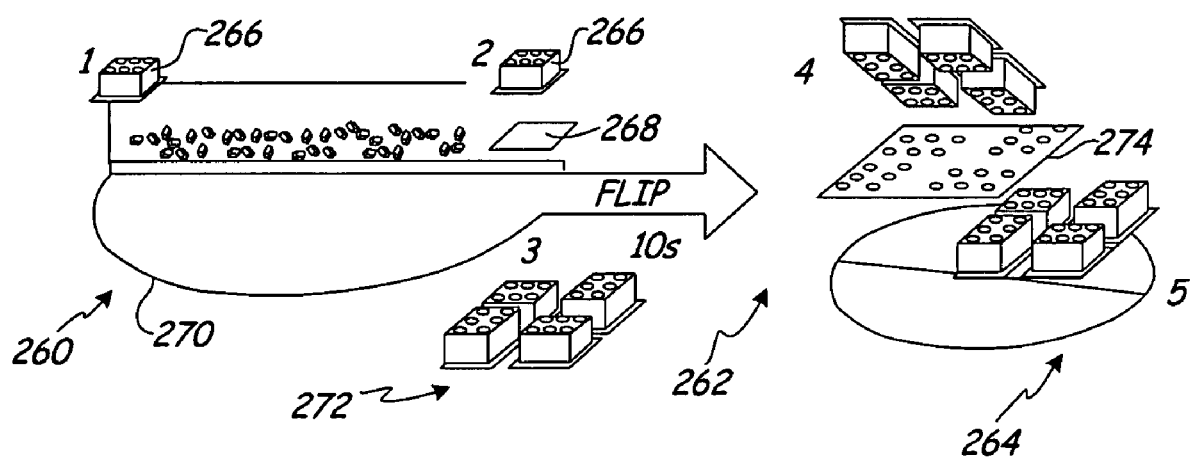
FIG. 14 illustrates a flip-chip component integration method utilizing a programmable self-assembly module, in accordance with one embodiment of the invention.

FIG. 14 illustrates how the programmable self-assembly module 260 is incorporated with a transfer solution 262 to accomplish flip chip integration of components, as illustrated at 264, in accordance with one embodiment of the invention. The module 260 operates to join components 266 to solder 268 of a substrate 270, in accordance with embodiments described above. The final assembled components on the substrate are shown at 272. Next, the assembled components on the substrate are flipped and oriented relative to interconnect contacts of a second substrate 274 and the components 266 are joined to the substrate 274. The final transfer step can be used to eliminate the use of solder to form the interconnects. For example, Gold-Gold bumps can be used.

This embodiment of the invention has several advantages. Exemplary advantages include effective material use through parallel redistribution of components (chiplets, dies), which is not possible using transfer-only solutions; and ability to choose the wafer size, pitch, and location of the chiplets on the final substrate independent of the manufacturing process that created the chiplets in the first place.

The programmable self-assembly in combination with robotic flip-chip transfer supports provides additional advantages. These include, for example, arbitrary IO layouts without the restrictions in location and size common in self-assembly only solutions. The flip-chip transfer decouples the self-assembly process from the IO layout. As a result, arbitrary IO layouts become possible, such as represented by interconnect dots in FIG. 14.

Although the present invention has been described with reference to preferred embodiments, workers skilled in the art will recognize that changes may be made in form and detail without departing from the spirit and scope of the invention. Although solder is used in general in the above materials, any type of material which can be made molten through heat may be used in accordance with the invention. For example, the solder can be replaced by other high surface tension liquid layers that are not miscible with the surrounding solution that otherwise still wet selected sites on the components. Activation of the receptor sites is not limited to the use of integrated heaters. For example the receptor site can be activated through the sequential deposition of a high surface tension liquid layer on the substrate followed by sequential self-assembly onto the receptor sites. The use of a scanning laser or light projection system can be incorporated as well to provide heat or to remove a masking layer through photochemical activation. The masking layer could be on the receptor site on the substrate or the components suspended in solution. Further, as used herein, the term "programming" refers to the ability to change or control how two or more components self-assemble together.

What is claimed is:

1. A method of self-assembly of components on a surface of a substrate comprising;
    obtaining a first component;
    obtaining a second component;
    assembling the first component onto the substrate by programming the surface for self assembling with the first component on to a receptor site on the surface of the substrate;
    assembling the second component by programming the surface for self assembling with the second component on to a receptor site on the surface of the substrate;
    assembling a third component on to the substrate components following the step of assembling the first and second components; and
    wherein the first, second and third components are all different types of components.

2. The method of self-assembly in accordance to claim 1 where a molten material is used to form a receptor on the substrate which adheres to specific materials resulting in the capture, self-assembly, self-alignment, and attachment of the suspended components at specific sites on the substrate surface.

3. A sequential self-assembly process where the localized adhesion is programmable using at least one of three concepts including: (i) sequential activation through electro deposition of the receptor material including solder; (ii) activation/deactivation of the receptor material including solder through integrated heaters, and (iii) activation/deactivation of the receptor material including solder through optical illumination.

4. The method of claim 3 including introducing pedestals to define docking sites to assemble components onto surfaces with unique angular orientation and contact pad registration.

5. The method of claim 3 including increasing the speed of self-assembly by concentrating component delivery employing a two-dimensional sheet of the assembly components that forms at the interface between two non-miscible liquids where the components assembly immediately onto the receptors as the receptor pass through this interface.

6. The method of claim 3 wherein the components are assembled in a fluid.

7. The method of claim 6 that makes use of a pulsating liquid flow of the fluid to levitate and mix components.

* * * * *